US 7,838,988 B1

(12) United States Patent  
Gurrum et al.

(10) Patent No.: US 7,838,988 B1
(45) Date of Patent: Nov. 23, 2010

(54) STUD BUMPS AS LOCAL HEAT SINKS DURING TRANSIENT POWER OPERATIONS

(75) Inventors: Siva Prakash Gurrum, Irving, TX (US); Kapil Heramb Sahasrabudhe, Dallas, TX (US); Vikas Gupta, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/543,763

(22) Filed: Aug. 19, 2009

Related U.S. Application Data

(63) Continuation-in-part of application No. 12/473,602, filed on May 28, 2009.

(51) Int. Cl.
*H01L 23/10* (2006.01)
*H01L 23/34* (2006.01)
*H01L 23/12* (2006.01)

(52) U.S. Cl. .................. 257/720; 257/706; 257/712; 257/713; 257/717; 257/718; 257/E21.497; 257/E21.499; 257/E21.508; 257/E21.514; 361/688; 361/704; 361/705; 361/707

(58) Field of Classification Search .......... 257/E21.497, 257/E21.499, E21.508, E21.514
See application file for complete search history.

(56) References Cited

U.S. PATENT DOCUMENTS

| 4,764,804 | A  * | 8/1988  | Sahara et al. ............... 257/717 |
| 7,566,590 | B2 * | 7/2009  | Zhong et al. ................ 438/119 |
| 2006/0237839 | A1 * | 10/2006 | Akram et al. ............... 257/712 |
| 2008/0164603 | A1 * | 7/2008  | Sturcken et al. ............ 257/713 |
| 2008/0265385 | A1 * | 10/2008 | Tsai et al. .................. 257/673 |

* cited by examiner

*Primary Examiner*—Savitri Mulpuri
*Assistant Examiner*—Mohsen Ahmadi
(74) *Attorney, Agent, or Firm*—Yingsheng Tung; Wade J. Brady, III; Frederick J. Telecky, Jr.

(57) ABSTRACT

A thermal management configuration for a flip chip semiconductor device is disclosed. The device includes a high power silicon based die having a metal bonding surface. A plurality of interconnects are formed on the metal surface and connected to a substrate. A plurality of thermal management stud bumps are formed on the metal bonding surface, the thermal management stud bumps positioned distinct from the interconnects and local to die hot spots, exposed ends of the thermal management stud bumps spaced from the substrate.

12 Claims, 4 Drawing Sheets

| TRIANGULAR PULSE CASES | % IMPROVEMENT | |
|---|---|---|
| ONE LAYER STUD BUMPS OVER 3 μm THICK Cu | 18.0 | WITH RESPECT TO 3 μm THICK Cu WITH NO STUD BUMPS |
| TWO LAYER STUD BUMPS OVER 3 μm THICK Cu | 28.4 | |
| ONE LAYER STUD BUMPS OVER 10 μm THICK Cu | 16.0 | WITH RESPECT TO 10 μm THICK Cu WITH NO STUD BUMPS |
| TWO LAYER STUD BUMPS OVER 10 μm THICK Cu | 25.3 | |

| SQUARE PULSE CASES | % IMPROVEMENT | |
|---|---|---|
| ONE LAYER STUD BUMPS OVER 3 μm THICK Cu | 16.8 | WITH RESPECT TO 3 μm THICK Cu WITH NO STUD BUMPS |
| TWO LAYER STUD BUMPS OVER 3 μm THICK Cu | 26.5 | |
| ONE LAYER STUD BUMPS OVER 10 μm THICK Cu | 14.0 | WITH RESPECT TO 10 μm THICK Cu WITH NO STUD BUMPS |
| TWO LAYER STUD BUMPS OVER 10 μm THICK Cu | 22.7 | |

STUD BUMPS AS LOCAL HEAT SINKS DURING TRANSIENT POWER OPERATIONS

CROSS REFERENCE TO RELATED APPLICATIONS

This application is a continuation-in-part of application Ser. No. 12/473,602, filed on May 28, 2009, and incorporated herein by reference, in its entirety.

FIELD

This invention relates generally to semiconductor thermal management, and more particularly placing and utilizing stud bumps as local heat sinks during transient power operations of a semiconductor device.

BACKGROUND

Heat dissipating structures have long been included in a variety of integrated circuit (IC) devices. Typical heat dissipating structures can be found in heat spreaders, cooling plates, Peltier devices, thermal adhesives, bonding over active circuits (BOAC) and use of varying structural materials in an effort to absorb and/or dissipate heat. In certain high power applications, an increase in temperature can adversely affect reliable device functioning.

For example, high power semiconductor devices experience transient periods immediately after input power is turned on or off. During these periods, high current and voltage spikes are present, resulting in peak power for the device. Such voltage spikes are particularly evident in power electronic integrated circuits (ICs), where power FETs constitute a large percentage of the die area. When excessive power is dissipated within a junction, its temperature rises. By way of example, a pulse period in a laterally diffused metal oxide semiconductor (LDMOS) device is 1-3 ms, and a temperature rise during that interval can be several hundred degrees. This temperature rise can limit the amount of power that can be handled by the device in any given cycle, which can be unsuitable for some high power applications. As junction temperature rises beyond a critical limit, the device can suffer reduced operating capability or irreversible damage.

BRIEF SUMMARY

Accordingly, a problem in high power IC devices is the need to dissipate heat generated during a transient (i.e. "ON") function of the device. By effectively dissipating heat, a lower junction temperature can be maintained over longer "ON" periods.

As used herein, a high power device refers to power silicon devices, including those with clustered transistors, FETs and LDMOS devices. In these types of devices there is metal across all or a major part of the die. The power transistors can be found in various numbers and positions in the die according to the specific device. Each transistor can be a hot spot. The hot spot is that location in the die which generates heat during operation.

As integrated circuit (IC) devices continue to shrink in size, thermal management becomes increasingly important. Therefore, to maintain the device's junction temperature below the maximum allowed, effective heat flow from the IC through the package to the ambient is essential. It is therefore a purpose of the exemplary embodiments herein to locally dissipate heat from a high power silicon based die during transient operating modes. Exemplary embodiments disclose thermal management stud bumps formed on a metal bonding surface of the die to store and dissipate heat generated in the high power die during transient operations, thereby suppressing the temperature rise and thus junction temperature of the die. The thermal management stud bumps can be formed on the metal bonding surface of the IC device, either in a single layer or stacked.

By locally dissipating heat from the die, advantages of reducing peak temperature rise of an IC device, maximizing a pulse width, and therefore duration of a power ON cycle, and maximize total power output for a given reliable operating temperature limit can be achieved. Although components of the IC devices do inherently dissipate heat, they can not be populated or positioned to the extent that they can effectively and consistently dissipate heat specifically at a hot spot. Also, while it may be proposed to form a thicker copper layer over the die, such an option is unsatisfactory at least because the cost is relatively high and not specific to hot spots. The thicker copper could be localized with a mask in fabrication, thereby reducing somewhat an amount of copper utilized, but this adds unnecessary steps. Another reason for avoiding these two options is that the greater the copper thickness, the higher the stress on the die. Because the thicker copper helps dissipate heat in modeling scenarios, the inventors realized that thermal management stud bumps could be specifically placed and achieve the same and better results without overloading the die with a thick copper layer.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments which may be practiced. These embodiments are described in sufficient detail to enable those skilled in the art to practice the embodiments and it is to be understood that other embodiments may be utilized and that changes may be made without departing from the scope of the invention. The following description is, therefore, merely exemplary.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

According to embodiments, a thermal management configuration of a semiconductor device can locally dissipate heat from a high power silicon based die. The structure includes thermal management stud bumps formed on a metal surface of the high power die to store and dissipate heat generated in the die during a high power transient operation, thereby suppressing the temperature rise and thus junction temperature of the die. Even further, the exemplary thermal management configuration is depicted in a flip chip device.

Figure 1:
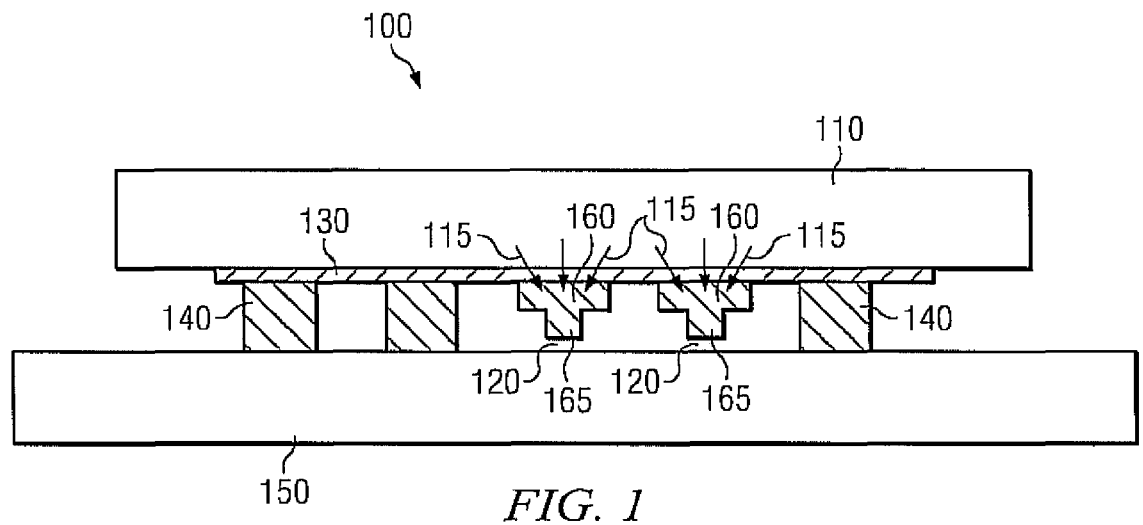
FIG. 1 is a side view depicting an exemplary semiconductor device according to certain embodiments.

FIG. 1 is a side view depicting a flip chip semiconductor device 100, according to certain embodiments. It should be readily apparent to those skilled in the art that FIG. 1 is exemplary and that other elements can be added, removed or modified without departing from the scope of the exemplary embodiments.

As depicted, the exemplary flip chip semiconductor device 100 can be incorporated into and include various other devices. The semiconductor device 100 can include a silicon based integrated circuit (IC) 110, a metal layer 130 over the integrated circuit 110, interconnects 140, a substrate 150 positioned such that the interconnects are formed between the metal layer 130 and substrate 150, and thermal management stud bumps 160 formed on the metal layer, an outer end 165 of the thermal management stud bumps 160 spaced from the substrate 150 as depicted at 120. Space 120 can be of an amount suitable to maintain separation without contact between outer ends 165 of the thermal management stud bump 160 and a facing surface of the substrate 150. While FIG. 1 depicts several components of the semiconductor device 100, one skilled in the art will realize that the semiconductor device 100 can include any number and type of components.

The silicon based integrated circuit 110 of the semiconductor device 100 can be formed of a material, using any process, to any dimension and specification, as known in the art. The silicon based IC 110 can include any silicon based power devices. The silicon based power devices can include clustered transistors, and back end interconnects. Further, the silicon based power device can include power field effect transistors (FETs). The power FETs can include laterally diffused metal oxide semiconductors (LDMOS), as known in the art.

It will be appreciated that the silicon based power IC devices 110 can generate heat during transient cycles of the device. A direction of the dissipated heat is depicted by arrows, from local hot spots 115 of the device, through the heat dissipating stud bumps 160 to an ambient.

In addition, and although not shown, a passivation layer can be formed of a material and components, using any process, to any dimension and specification, as known in the art. The passivation layer can include, for example, a passivation glass. The passivation layer can be formed on the power silicon based IC 110 and include openings formed therein over the IC device 110 to the metal layer.

The metal layer 130 can be formed on the passivation layer. The metal layer 130 can be formed of components, using any process, to any dimension and specification, as known in the art. The metal layer 130 can include a metal bonding layer of conductive material, for example copper, deposited or otherwise formed, to a predetermined thickness. The metal bonding layer 130 can be deposited or otherwise formed over all or substantially all of a surface of the IC device 110. The metal bonding layer 130 can further conductively contact the IC device 110. The metal bonding layer 130 can be deposited to a thickness of between about 0.5 µm to about 5 µm on a surface of the IC device 110.

The interconnects 140 can be formed of a material and components, using any process, to any dimension and specification, as known in the art. Interconnects 140 can be formed as, for example, a solder bump, a wire bond stud bump, and using copper pillar technologies. Interconnects 140 can include a single layer of interconnects 140 formed on a surface of the metal bonding layer 130. Interconnects 140 can further include multilayer interconnects formed on a surface of the metal bonding layer 130. Interconnects 140 can be connected to the substrate 150 as known in the art. The substrate 150 can be formed of a material and components, using any process, to any dimension and specification, as known in the art. For example, the substrate 150 can include an organic or ceramic substrate.

The thermal management stud bumps 160 can be formed on a surface of the metal bonding layer 130. The thermal management stud bumps 160 do not have to electrically connect to the substrate 150; however electrical connection is not precluded. Stud bump bonding is a modified wire bonding process. Like wire bonding, there is bonding of the ball to the substrate. Unlike wire bonding, there is no second wire bond to a lead. The wire is terminated after the first bond, so there is only a bump on the substrate. To create the stud bump, a ball is formed using a standard ball bumping process. After the ball is bonded to the die pad, and the bond head moves to tear the wire. The thermal management stud bumps 160 can have a height such that a clearance remains between an exposed end 165 of the thermal management stud bump 160 and a surface of the substrate 150. Wire diameter and bonding force can be varied to achieve the desired height for a given flip chip configuration. In addition, a height of the thermal management stud bumps 160 can be coined using a metallic plate. Coining can result in a common height of all coined thermal management stud bumps.

It will be appreciated that the metal bonding layer 130 in itself can act as a heat sink/spreader to remove heat from the die 110. However, with a thinner metal bonding layer in the range of about 3-6 µm, additional mass is needed to restrict a junction temperature rise during a high power transient cycle. Accordingly, the thermal management stud bumps 160 can provide the additional needed mass.

More specifically, the thermal management stud bumps 160 can be formed local to die hot spots. Die hot spots are those regions of the silicon based IC device 110 which can exhibit an increase in temperature during a transient function of the semiconductor device. For example, during a high power transient operation, the junction temperature increases considerably during a 'Power ON' cycle. In the case of high voltage power devices in LBC (LDMOS), the pulse period can be 1-3 ms, and temperature rise can be several hundred degrees. The thermal management stud bumps 160 essentially act as local thermal capacitors and have enough mass to store and dissipate a considerable amount of heat.

Because the thermal management stud bumps 160 can be positioned to intercept heat dissipated from the die, an increase in die temperature during the power cycle can be reduced, thereby enabling higher power in the device at a lower temperature, thereby maximizing a power "ON" duration, without damage to the device.

Figure 2:
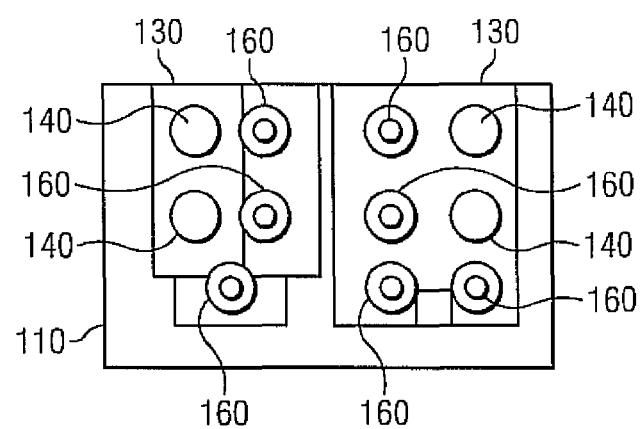
FIG. 2 is a top plan view depicting thermal management stud bump configurations of an exemplary semiconductor device according to certain embodiments.

FIG. 2 is a top plan view of FIG. 1, absent the substrate 150, depicting an exemplary layout of interconnects 140 and thermal management stud bumps 160, according to certain embodiments. It should be readily apparent to those skilled in the art that FIG. 2 is exemplary and that other elements can be added, removed or modified without departing from the scope of the exemplary embodiments.

In FIG. 2, the silicon based die 110, metal bonding layer 130, and interconnects 140 are also depicted. Thermal management stud bumps 160 can be positioned proximate to interconnects 140 and on a surface of the metal bonding layer 130. More specifically, the thermal management stud bumps 160 can be formed local to die hot spots. Die hot spots can be those regions of the silicon based IC device 110 which can exhibit an increase in temperature during a transient function of the semiconductor device. The thermal management stud bumps 160 can populate all or substantially all of the metal area of the metal bonding layer 130, according to certain fabrication parameters such as the pitch of the thermal management stud bumps 160, the number of interconnects 140, and capillary size for forming interconnects 140. Further, the thermal management stud bumps 160 can be located proximate to a heat source if a die has a limited surface area. A majority of the thermal management stud bumps 160 can be concentrated in the heat producing area of the die in certain aspects of the device.

Even further, the thermal management stud bumps 160 can be positioned at corners of the die 110 on the metal bonding layer 130. Such positioning can utilize the thermal management stud bumps 160 as delamination resisting structures. For example, underfill material can fill an area surrounding interconnects 140 and thermal management stud bumps 160. With the additional structures present on the die surface, there can be additional surface area to which a mold compound can adhere, thereby further limiting delamination of the mold compound from the package.

The thermal management stud bumps 160 can include a thermally conductive material, capable of dissipating heat from the device. For example, the thermal management stud bumps can be formed of copper, gold, aluminum, and alloys thereof formed on the device. The thermal management stud bumps can be particularly positioned to be local to known or expected IC hot spots. The thermal management stud bumps can be further positioned to intercept heat dissipated from the IC device. In particular, the thermal management stud bumps can store and then gradually dissipate heat therefrom, according to an amount of heat generated in or by the IC device.

Figures 3, 4:
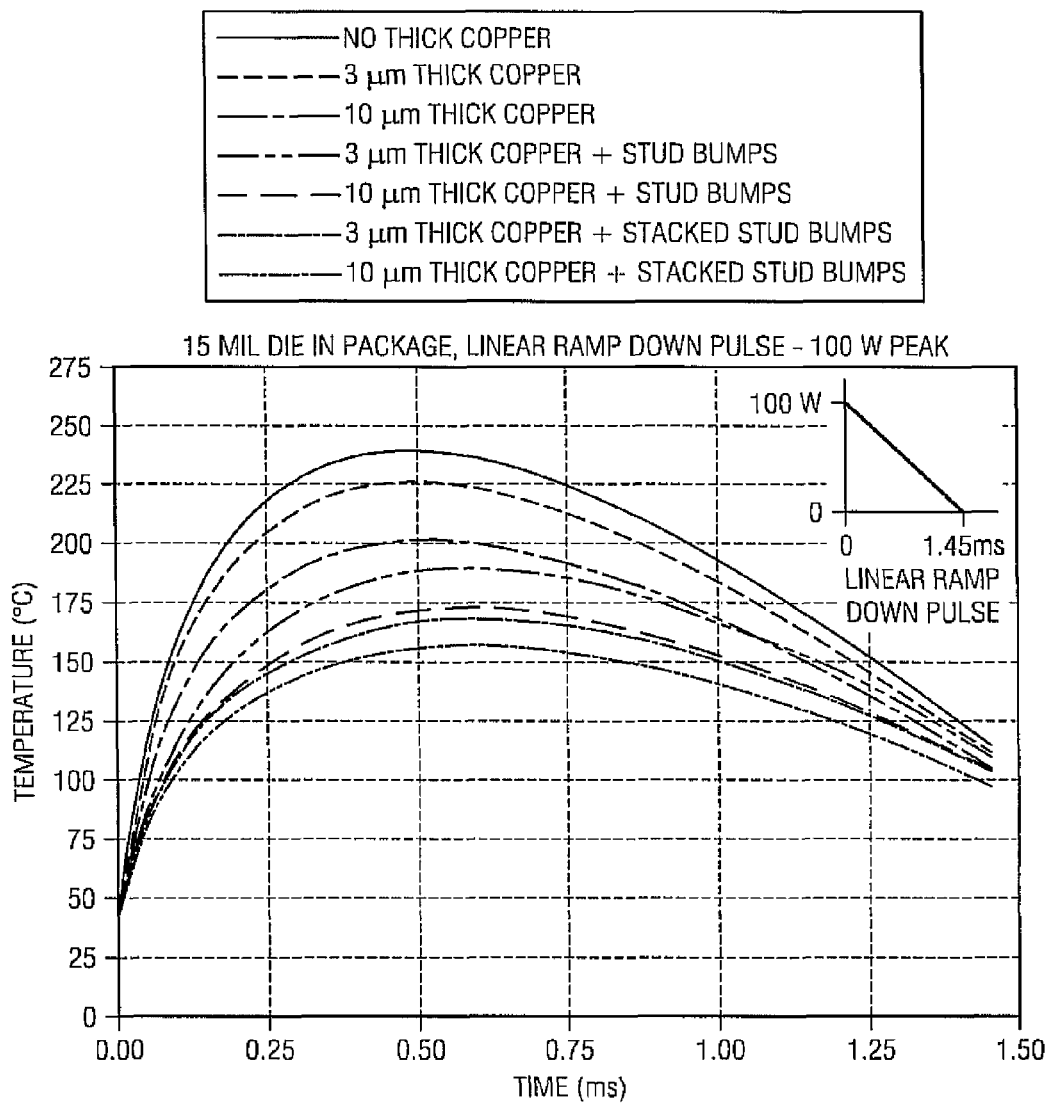
FIG. 3 is a graph depicting prophetic relational outputs according to certain embodiments.
FIG. 4 is a chart depicting prophetic device improvements according to FIG. 3.

Various comparisons can be made to demonstrate the effectiveness of the thermal management stud bumps described herein. For example, FIG. 3 depicts a change in temperature over time for a 15 mils die in package, with a linear ramp down pulse having a 100 W peak. Each of a plurality of configurations is represented in FIG. 3. The representations include that of no thick copper, 3 μm thick copper, 10 μm thick copper, 3 μm thick copper plus thermal management stud bumps of a single layer, 10 μm thick copper plus thermal management bumps of a single layer, 3 μm copper plus stacked thermal management stud bumps; and 10 μm thick copper plus stacked thermal management stud bumps. As summarized in FIG. 4, an improvement percentage ranges from about 18% to about 25.3%. With one layer of thermal management stud bumps over 3 μm thick copper, the thermal model results showed an 18% improvement in heat dissipation. With thermal management stud bumps stacked to two layers over 3 μm thick copper, the thermal model results showed a 28.4% improvement in heat dissipation. With one layer of thermal management stud bumps over 10 μm thick copper, the thermal model results showed a 16% improvement in heat dissipation. With thermal management stud bumps stacked to two layers over 10 μm thick copper, the thermal model results showed a 25.3% improvement in heat dissipation.

Figures 5, 6:
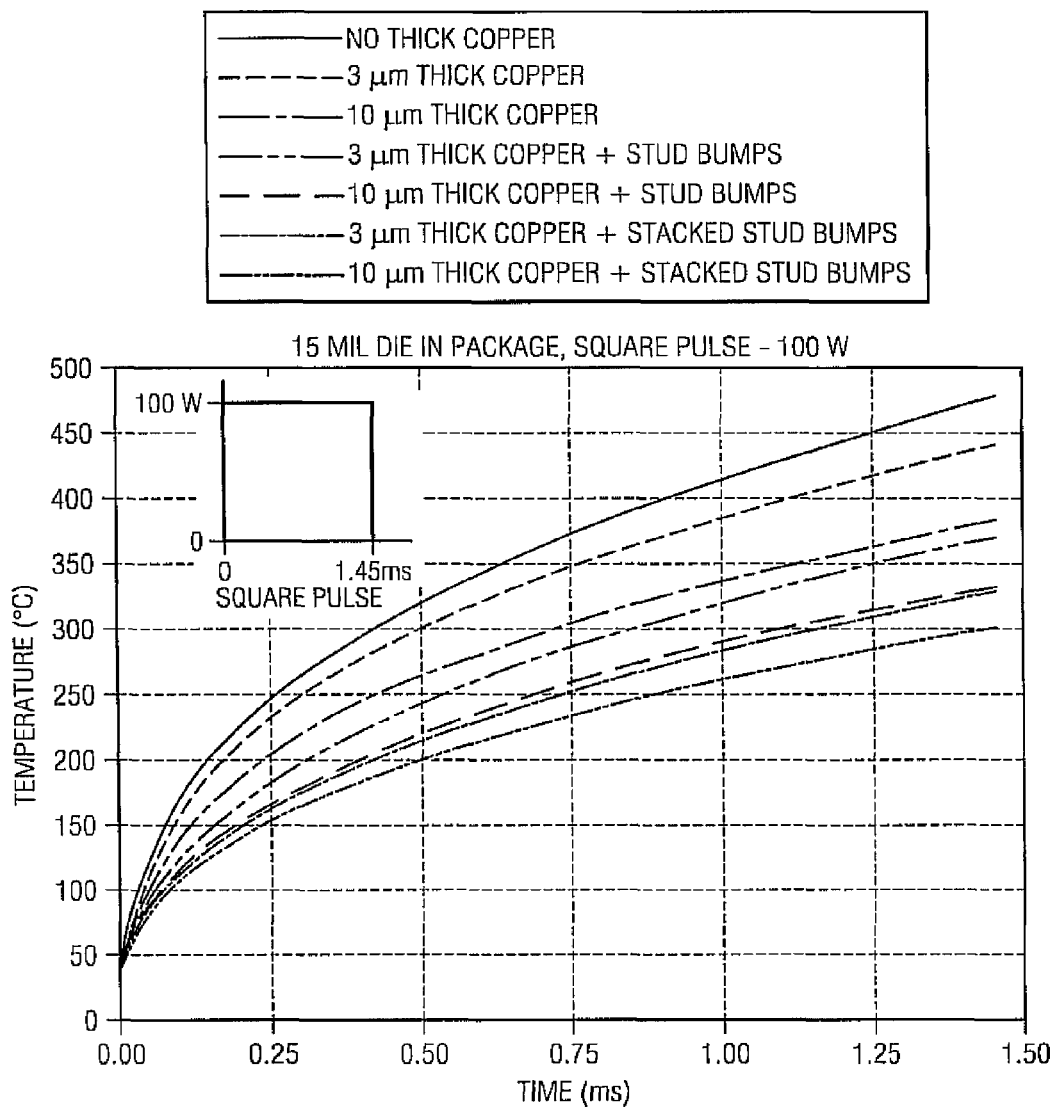
FIG. 5 is a chart depicting prophetic relational outputs according to certain embodiments.
FIG. 6 is a chart depicting prophetic device improvements according to FIG. 5.

FIG. 5 depicts a change in temperature over time for a 15 ml die in package, with a square pulse having a 100 W peak. Each of a plurality of configurations is represented in FIG. 5. The representations include that of no thick copper, 3 μm thick copper, 10 μm thick copper, 3 μm thick copper plus thermal management stud bumps of a single layer, 10 μm thick copper plus thermal management bumps of a single layer, 3 μm copper plus stacked thermal management stud bumps; and 10 μm thick copper plus stacked thermal management stud bumps. As summarized in FIG. 6, an improvement percentage ranges from about 16.8% to about 22.7%. With one layer of thermal management stud bumps over 3 μm thick copper, the thermal model results showed a 16.8% improvement in heat dissipation. With thermal management stud bumps stacked in two layers over 3 μm thick copper, the thermal model results showed a 26.5% improvement in heat dissipation. With one layer of thermal management stud bumps over 10 μm thick copper, the thermal model results showed a 14% improvement in heat dissipation. With thermal management stud bumps stacked in two layers over 10 μm thick copper, the thermal model results showed a 22.7% improvement in heat dissipation.

Figure 7:
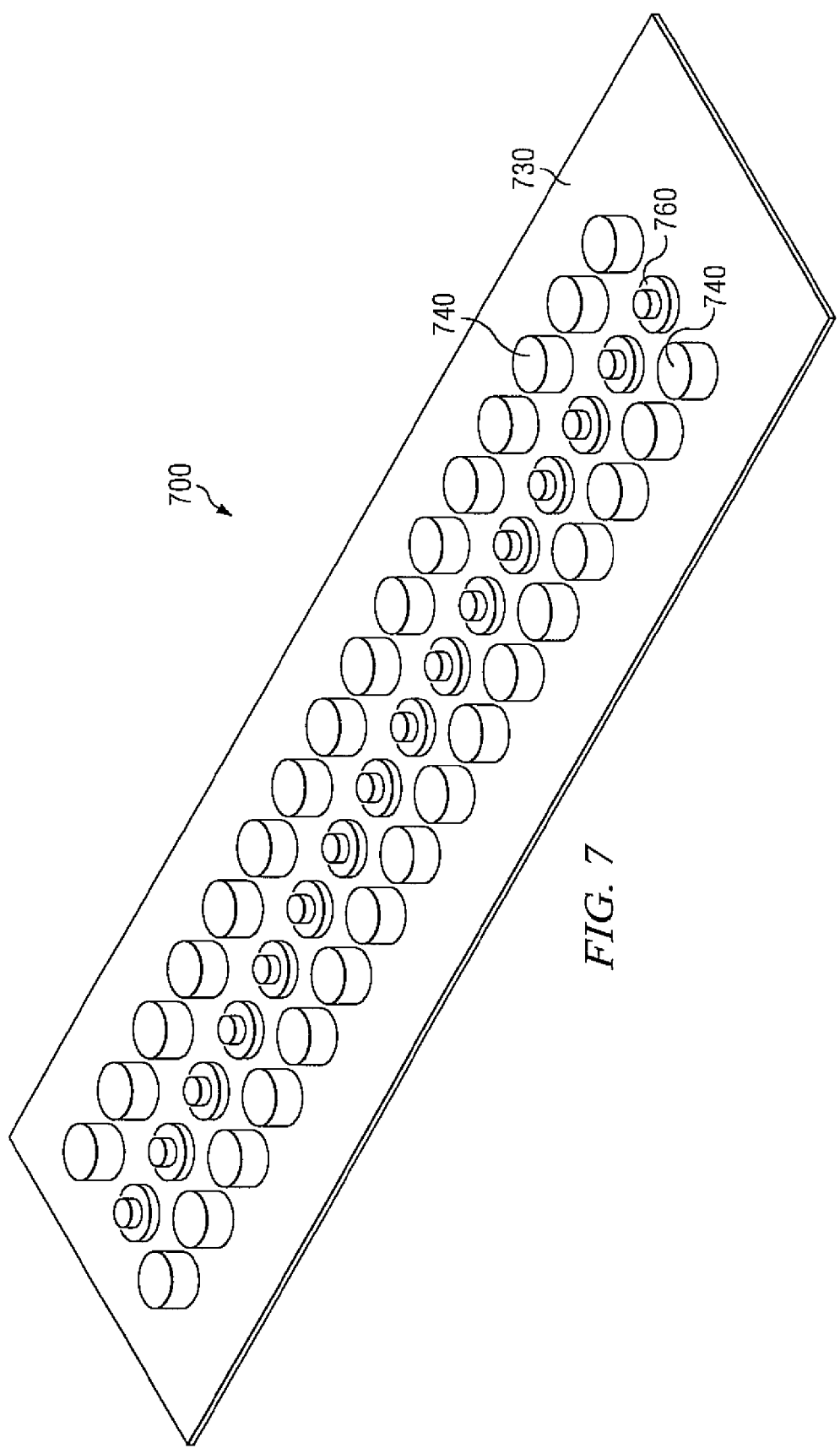
FIG. 7 depicts an exemplary layout of stud bumps on a substrate.

FIG. 7 depicts an exemplary heat dissipating layout 700 according to certain embodiments. It should be readily apparent to those skilled in the art that FIG. 7 is exemplary and that other elements can be added, removed or modified without departing from the scope of the exemplary embodiments.

In certain embodiments, thermal management stud bumps 760 can be formed in a heat dissipating pattern on a substrate 730. The substrate 730 can be a metal layer and the metal layer can further be supported on a surface of a silicon die. The thermal management stud bumps 760 can be a single layer of stud bumps 760; however, as described above, the thermal management stud bumps can include multiple layers of stacked thermal management stud bumps. The exemplary layout 700 can be used in any of the exemplary embodiments disclosed above. As illustrated, the thermal management stud bumps can be positioned local to known or expected IC hot spots.

Thus, the exemplary embodiments promote numerous technical advantages, including but not limited to improved thermal properties, resilience, longevity, manufacturability, and reliability. In demonstrated thermal model results, the exemplary embodiments can reduce a peak temperature rise for a given pulse width and power profile. The exemplary embodiments can increase ON cycle times during transient operation without affecting the device performance and reduce dependence on current thick BOAC layer for heat removal. The increased ON cycle times can increase an overall total power output for a device. Use of thermal management stud bumps can lessen the need for a thick Cu layer in BOAC. The thinner Cu results in cost savings, and an ability to further decrease the transistor on-resistance. Reducing a thickness of the copper layer an also reduce related reliability issues such as PO cracking and Al extrusion without adversely affecting the device thermal performance. The presence of the thermal management stud bumps in addition to the wire bonds can improve adhesion between an underfill and the die by acting as posts around which the underfill can form. Thermal management stud bumps can be positioned at corners of the die and can act as delamination resisting structures.

While the invention has been described with reference to the exemplary embodiments thereof, those skilled in the art will be able to make various modifications to the described embodiments without departing from the true spirit and scope. The terms and descriptions used herein are set forth by way of illustration and are not meant as limitations. In particular, although the method has been described by examples, the steps of the method may be performed in a different order than illustrated or simultaneously. Furthermore, to the extent that the terms "including", "includes", "having", "has", "with", or variants thereof are used in either the detailed description and the claims, such terms are intended to be inclusive in a manner similar to the term "comprising". As used herein, the term "one or more of" with respect to a listing of items such as, for example, A and B, means A alone, B alone, or A and B.

Other embodiments of the present disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A thermal management configuration for transient operation of a flip chip semiconductor device, the configuration comprising:
    a high power die comprising a metal bonding surface;
    a plurality of interconnects formed on the metal bonding surface and connected to a substrate; and
    a plurality of heat dissipating stud bumps formed on the metal bonding surface and local to die hot spots, exposed ends of the heat dissipating stud bumps spaced from the substrate.

2. The device of claim 1, wherein the heat dissipating stud bumps comprise a single layer of stud bumps.

3. The device of claim 1, wherein the heat dissipating stud bumps comprise stacked stud bumps.

4. The device of claim 1, wherein the heat dissipating stud bumps are positioned to intercept heat generated in the die.

5. The device of claim 1, wherein the heat dissipating stud bumps temporarily store and then gradually dissipate heat.

6. The device of claim 1, wherein the metal bonding surface comprises one or more of copper, gold and aluminum and alloys thereof.

7. A flip chip semiconductor device comprising:
    a high power silicon based integrated circuit (IC) having transient operations; a metal bonding layer formed over the IC;
    interconnects formed on the metal bonding layer, the interconnects connected to a substrate; and
    thermal management stud bumps formed on the metal bonding layer and local to die hot spots, exposed ends of the thermal management stud bumps spaced from the substrate.

8. The device of claim 7, wherein the heat dissipating stud bumps comprise a single layer of stud bumps.

9. The device of claim 7, wherein the thermal management stud bumps comprise stacked stud bumps.

10. The device of claim 7, wherein the thermal management stud bumps temporarily store and then gradually dissipate heat.

11. The device of claim 7, wherein the thermal management stud bumps comprise a material selected from one or more of copper, gold and aluminum and alloys thereof.

12. The device of claim 7, wherein the metal bonding layer comprises one or more of copper, gold and aluminum and alloys thereof.

* * * * *